United States Patent
Irisawa et al.

(10) Patent No.: US 7,622,773 B2
(45) Date of Patent: Nov. 24, 2009

(54) SEMICONDUCTOR DEVICE INCLUDING MULTI-GATE METAL-INSULATOR-SEMICONDUCTOR (MIS) TRANSISTOR

(75) Inventors: Toshifumi Irisawa, Tokyo (JP); Toshinori Numata, Kamakura (JP); Shinichi Takagi, Tsukuba (JP); Naoharu Sugiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/705,450

(22) Filed: Feb. 13, 2007

(65) Prior Publication Data
US 2007/0241399 A1 Oct. 18, 2007

(30) Foreign Application Priority Data
Feb. 15, 2006 (JP) ............................. 2006-038252

(51) Int. Cl.
*H01L 27/12* (2006.01)
(52) U.S. Cl. ........................................ 257/347; 438/176
(58) Field of Classification Search ................ 438/149, 438/151, 157, 176, 198, 211, 257, 283, 588, 438/142, 195, 197, 213, 229; 257/66, 72, 257/250, 331, 347, 350–353, 365, E21.179, 257/E27.112, E29.264, E29.275, E29.319, 257/E21.421, 213, 221, 249, 308, 366, 368, 257/401, E21.014
See application file for complete search history.

(56) References Cited

U.S. PATENT DOCUMENTS

| | | | |
|---|---|---|---|
| 6,707,119 B2 * | 3/2004 | Nishibe et al. | ............... 257/401 |
| 6,727,550 B2 | 4/2004 | Tezuka et al. | |
| 6,774,390 B2 | 8/2004 | Sugiyama et al. | |
| 2004/0112964 A1 | 6/2004 | Empedocles et al. | |
| 2005/0006673 A1 | 1/2005 | Samuelson et al. | |
| 2005/0156202 A1 * | 7/2005 | Rhee et al. | ................... 257/213 |
| 2005/0263831 A1 * | 12/2005 | Doris et al. | ................. 257/401 |
| 2008/0006883 A1 * | 1/2008 | Mori | ......................... 257/379 |

FOREIGN PATENT DOCUMENTS

| | | |
|---|---|---|
| CN | 1645629 A | 7/2005 |
| DE | 11 2006 001 589 | 4/2008 |

(Continued)

OTHER PUBLICATIONS

Korean Intellectual Property Office Notice of Allowance issued in copending Application No. 10-2007-15185 dated Feb. 27, 2008, and English translation thereof.

(Continued)

*Primary Examiner*—David Vu
*Assistant Examiner*—Suberr Chi
(74) *Attorney, Agent, or Firm*—Finnegan, Henderson, Farabow, Garrett & Dunner, L.L.P.

(57) ABSTRACT

In a semiconductor device including a multi-gate MIS transistor having a channel on a plurality of surfaces, a gate electrode is formed on a gate insulating film on side surfaces of an island-like semiconductor layer formed along a given direction on an insulating film, and source/drain electrodes are formed in contact with the semiconductor layer. The semiconductor layer has a plurality of side surfaces along the given direction. All angles formed by adjacent side surfaces are larger than 90°. A section perpendicular to the given direction is vertically and horizontally symmetrical.

17 Claims, 6 Drawing Sheets

FOREIGN PATENT DOCUMENTS

| | | |
|---|---|---|
| JP | 2003-23160 | 1/2003 |
| JP | 2003-243667 | 8/2003 |
| JP | 2005-203798 | 7/2005 |
| KR | 10 2005 0110190 | 11/2005 |
| WO | WO 2004/010552 | 1/2004 |
| WO | WO 2005/096076 | * 10/2005 |

OTHER PUBLICATIONS

T. Mizuno et al., "High Velocity Electron Injection MOSFETs for Ballistic Transistors using SiGe/Strained-Si Heterojunction Source Structures," 2004 Symposium on VLSI Technology Digest of Technical Papers (2004), pp. 202-203.

T. Tezuka et al., "Dislocation-free relaxed SiGe-on-insulator mesa structures fabricated by high-temperature oxidation," Journal of Applied Physics (Dec. 15, 2003), 94:7553-59.

S. Takagi, "Re-examination of Subband Structure Engineering in Ultra-Short Channel MOSFETs under Ballistic Carrier Transport," 2003 Symposium on VLSI Technology Digest of Technical Papers (2003), pp. 115-116.

T. Tezuka et al., "A Novel Fabrication Technique of Ultrathin and Relaxed SiGe Buffer Layers with High Ge Fraction for Sub-100 nm Strained Silicon-on-Insulator MOSFETs," Jpn. J. Appl. Phys. (Apr. 2001), pp. 2866-2874.

Y. Choi et al., "Sub-20nm CMOS FinFET Technologies," Technical Digest of International Electron Devices Meeting (2001), pp. 421-424.

Second Office Action issued by the Chinese Patent Office on Oct. 24, 2008, for Chinese Patent Application No. 2007100879678, and English-language translation thereof.

German Patent and Trademark Office Official Action issued in co-pending Application No. 10 2007 007 261.0-33 mailed Jun. 16, 2008, and English language translation thereof.

* cited by examiner

SEMICONDUCTOR DEVICE INCLUDING MULTI-GATE METAL-INSULATOR-SEMICONDUCTOR (MIS) TRANSISTOR

CROSS-REFERENCE TO RELATED APPLICATIONS

This application is based upon and claims the benefit of priority from prior Japanese Patent Application No. 2006-038252, filed Feb. 15, 2006, the entire contents of which are incorporated herein by reference.

BACKGROUND OF THE INVENTION

1. Field of the Invention

The present invention relates to a semiconductor device including a multi-gate metal-insulator-semiconductor (MIS) transistor having a channel on a plurality of surfaces, and a method of fabricating the same.

2. Description of the Related Art

Recently, a multi-gate MISFET having a strong short channel effect immunity is attracting attention. Examples of the multi-gate MISFET are a double-gate MISFET having gates on both the right and left surfaces of a projecting portion (fin) serving as an active region, a tri-gate MISFET having gates on three surfaces, i.e., the upper surface and the right and left surfaces, and a gate-all-around (GAA) MISFET in which a gate covers the whole fin. Each structure increases the dominating power of the gate compared to the conventional planar MISFET, thereby suppressing the short channel effect. A method using Ge as a channel in order to increase the channel mobility is also proposed. A combination of Ge as a high-mobility material and any of these multi-gate MISFETs is presumably well applicable to a low-power-consumption, high-performance element.

The multi-gate MISFET as described above normally has a rectangular fin section, and therefore has the problem that electric field concentration readily occurs at corners, and this readily causes gate insulating film breakdown. Accordingly, a multi-gate MISFET having a polygonal channel with five or more corners in order to give each fin corner an obtuse angle and to alleviate the field concentration is proposed (JP-A 2005-203798 (KOKAI)).

The method of JP-A 2005-203798, however, forms a channel portion by selective epitaxial growth from an initial substrate, and uses a facet surface which appears upon the selective epitaxial growth, so the channel section has no vertical symmetry. Accordingly, the polygonal channel formed by this method is unsuitable for a GAA-MISFET having the highest short channel effect immunity. This is so because an electric field does not vertically symmetrically act, and this makes the device unstable. Also, applying a strain to a multi-gate MISFET fabricated by this method in order to increase the current drive requires so-called hetero-epitaxial growth which grows crystals of a channel material different from the material of an initial substrate. Unfortunately, a dissimilar-material hetero-interface like this acts as a defect formation source and hence has an adverse effect on the reliability and leak characteristics of the device.

On the other hand, a multi-gate Ge-MISFET using Ge as a channel material can be generally fabricated by using a bulk Ge substrate or Ge-on-insulator (GOI) substrate as an initial substrate. However, Ge greatly differs from Si in process conditions, and no process of forming a narrow fin by using Ge has been established yet. Also, forming a GOI layer on an entire substrate having a large diameter makes the defect density very difficult to reduce. A GOI substrate thus having many defects greatly increases the leakage current.

BRIEF SUMMARY OF THE INVENTION

According to an aspect of the present invention, there is provided a semiconductor device comprising:

a semiconductor layer formed on an insulating film in an island shape along a given direction and having a plurality of side surfaces along the given direction, all angles formed by adjacent ones of the side surfaces being larger than 90°, and a section of the semiconductor layer perpendicular to the given direction being vertically and horizontally symmetrical;

a gate insulating film formed on a region on the side surfaces, which is to be used as a channel;

a gate electrode formed on the gate insulating film; and source and drain electrodes formed in contact with the semiconductor layer with the gate electrode being arranged between the source and drain electrodes.

According to another aspect of the present invention, there is provided a method of fabricating a semiconductor device comprising:

forming an SiGe layer on an insulating film;

selectively etching the SiGe layer in an island shape along a given direction in accordance with a MIS transistor formation region, to make an island SiGe layer;

oxidizing the island SiGe layer to form a Ge layer having a plurality of side surfaces along the given direction, all angles formed by adjacent ones of the side surfaces being larger than 90°, and a section of the Ge layer perpendicular to the given direction being vertically and horizontally symmetrical;

forming a gate insulating film on a region on the side surfaces of the Ge layer, the region being to be used as a channel;

forming a gate electrode on the gate insulating film; and forming source and drain electrodes in contact with the Ge layer by using the gate electrode as a mask.

DETAILED DESCRIPTION OF THE INVENTION

Embodiments of the present invention will be explained in detail below with reference to the accompanying drawing.

First Embodiment

Figure 1:
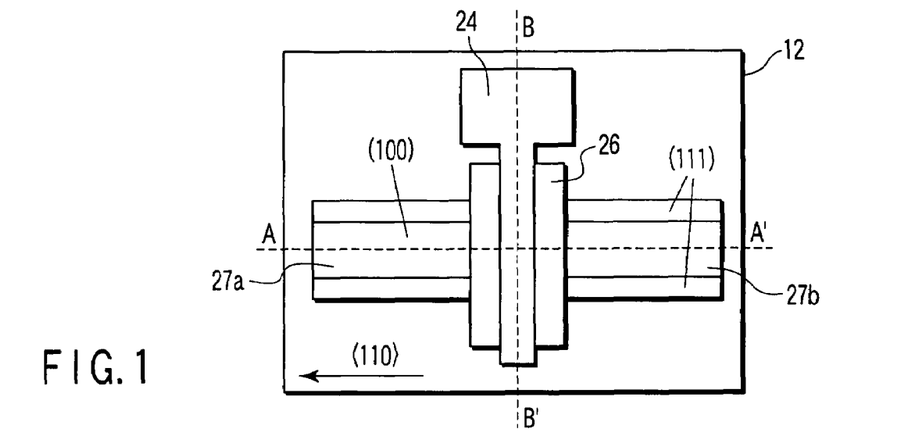
FIG. 1 is a plan view showing an outline of the arrangement of a multi-gate MISFET according to the first embodiment.
Figure 2:
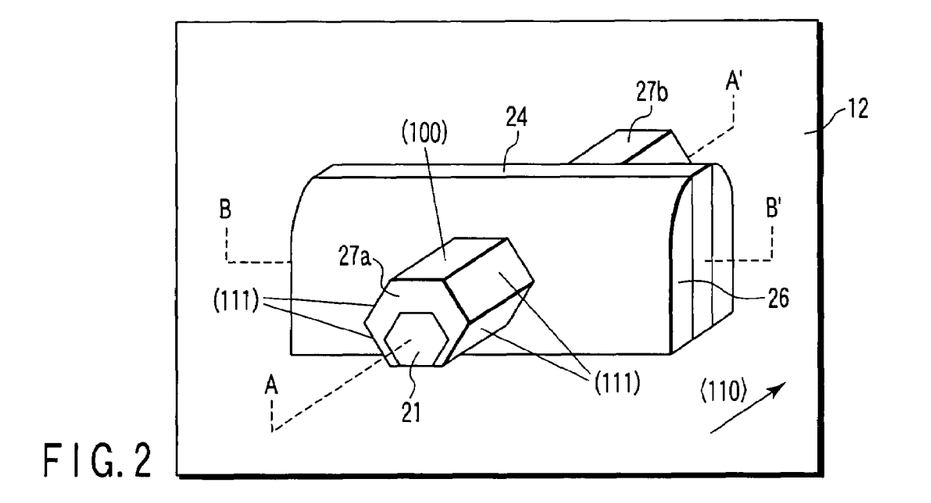
FIG. 2 is a perspective view showing an outline of the arrangement of the multi-gate MISFET according to the first embodiment.
Figure 3:
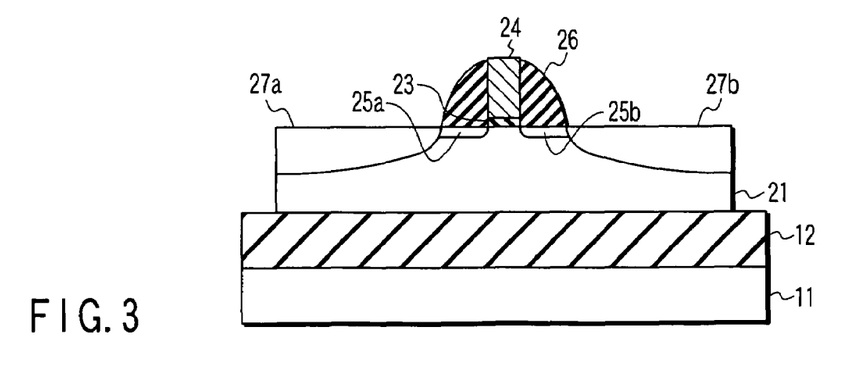
FIG. 3 is a view showing a section taken along a line A-A' in FIG. 1.
Figure 4:
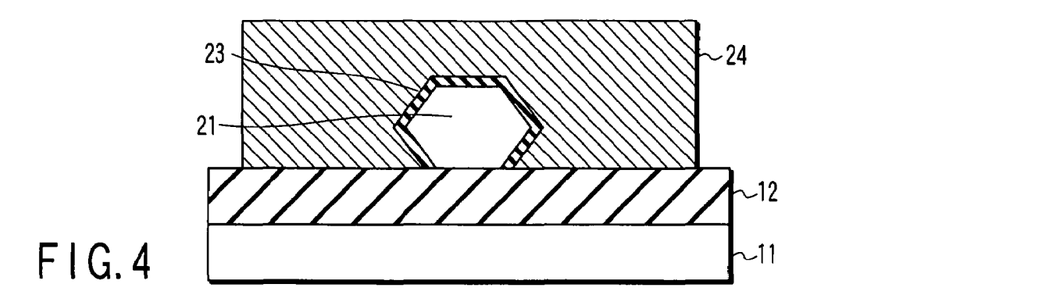
FIG. 4 is a view showing a section taken along a line B-B' in FIG. 1.

FIGS. 1 to 4 are views for explaining an outline of the arrangement of a multi-gate MISFET according to the first embodiment of the present invention. FIG. 1 is a plan view, FIG. 2 is a perspective view, FIG. 3 is a sectional view taken along a line A-A' in FIG. 1, and FIG. 4 is a sectional view taken along a line B-B' in FIG. 4.

A buried insulating film 12 such as an Si oxide film is formed on a (100) Si substrate 11, and an island-like Ge layer (semiconductor layer) 21 is formed along the <110>-axis direction on the buried insulating film 12 (FIGS. 1 to 4). The island (projection) of the Ge layer 21 is an active region for a FinFET. The Ge layer 21 has a hexagonal section perpendicular to the <110>-axis direction, so all angles formed by adjacent side surfaces are larger than 90° (FIG. 2).

A gate insulating film 23 is formed on the side surfaces of the Ge layer 21 so as to surround the central portion of the Ge layer 21, and a gate electrode 24 is formed on the gate insulating film 23 (FIG. 4). That is, the gate electrode 24 is formed on the buried insulating film 12 in a direction perpendicular to the <110>-axis direction, and intersects the central portion of the Ge layer 21 (FIGS. 1 and 2). Source/drain extension layers 25 (25a and 25b) are formed by doping an impurity into the Ge layer 21 by using the gate electrode 24 as a mask (FIG. 3).

Sidewall insulating films 26 are formed on the side portions of the gate electrode 24 by using the sidewall-etchback technique (FIGS. 2 and 3). The gate electrode 24 and gate sidewall insulating films 26 are used as masks to form source/drain electrodes 27 (27a and 27b) in contact with the Ge layer 21 and extension layers 25 (FIGS. 2 and 3). In this manner, the multi-gate MISFET is fabricated.

The channel of the MISFET of this embodiment is made of Ge, and a section in the channel width direction (a section cut in a direction perpendicular to the channel length direction) is a hexagon. The four right and left surfaces viewed in the channel length direction are (111) surfaces, and the two upper and lower surfaces viewed in the same direction are (100) surfaces. The gate insulating film, 23 can be made of $SiO_2$ or an insulating film material (high-k insulating film) having a dielectric constant higher than that of $SiO_2$. Examples are SiON, $Si_3N_4$, $Al_2O_3$, $Ta_2O_5$, $TiO_2$, $La_2O_5$, $CeO_2$, $ZrO_2$, $HfO_2$, $SrTiO_3$, and $Pr_2O_3$. Materials such as Zr silicate and Hf silicate formed by mixing metal ions in silicon oxide are also effective, and these materials may also be combined.

A material necessary for a transistor of each generation can be appropriately selected as the gate electrode 24. Examples are poly-Si, SiGe, silicide, germanosilicide, and various kinds of metals. Germanide, germanosilicide, or silicide can be used as the source/drain electrodes 27. Referring to FIG. 3, the impurity-doped semiconductor layers 25 are formed between the source/drain electrodes 27 and channel. However, the entire structure may also be made of a metal. That is, a so-called metal source/drain structure may also be formed without forming the impurity-doped semiconductor layers 25 between the source/drain electrodes 27 and channel. The gate sidewall insulating films 26 are preferably Si oxide films, Si nitride films, or stacked films of these films.

FIGS. 5A to 5D are schematic views showing main steps in order to explain the process of fabricating the MISFET structure according to the first embodiment.

Figure 5A:
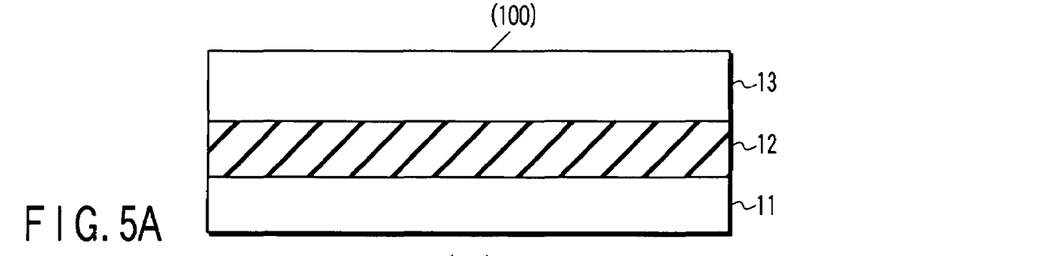
FIGS. 5A to 5D are sectional views showing the fabrication steps of the multi-gate MISFET according to the first embodiment.

As shown in FIG. 5A, an initial substrate is an SiGe-on-insulator (SGOI) substrate, or a substrate obtained by epitaxially growing a layer containing SiGe on an Si-on-insulator (SOI) substrate. That is, a buried insulating film 12 is formed on an Si substrate 11, and an SiGe layer 13 is formed on the buried insulating film 12.

The SGOI substrate may also be formed by using oxidation-induced Ge condensation after SiGe is epitaxially grown on the SOI substrate (T. Tezuka et al., "A Novel Fabrication Technique of Ultrathin and Relaxed SiGe Buffer Layers with High Ge Fraction for Sub-100-nm Strained Silicon-on-Insulator MOSFETs", Japanese Journal of Applied Physics, vol. 40, pp. 2866-74, 2001). A laminated SGOI substrate may also be used as the SGOI substrate. Although the fabrication method of the SGOI substrate is not limited, the Ge composition in SGOI is desirably 50% or less in order to perform fin processing later by a process equal to that of Si.

Figure 6:
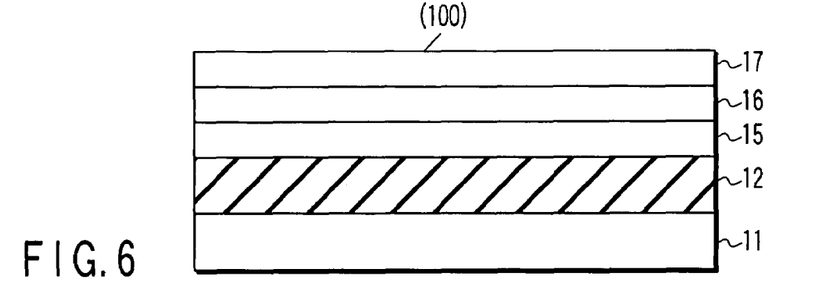
FIG. 6 is a sectional view which explains another example of an initial substrate used in the first embodiment, and shows an Si/Ge/Si stacked structure.

As shown in FIG. 6, it is also possible to use a three-layered structure including Si layer 15/SiGe layer 16/Si layer 17, instead of the SiGe layer 13.

Figure 5B:
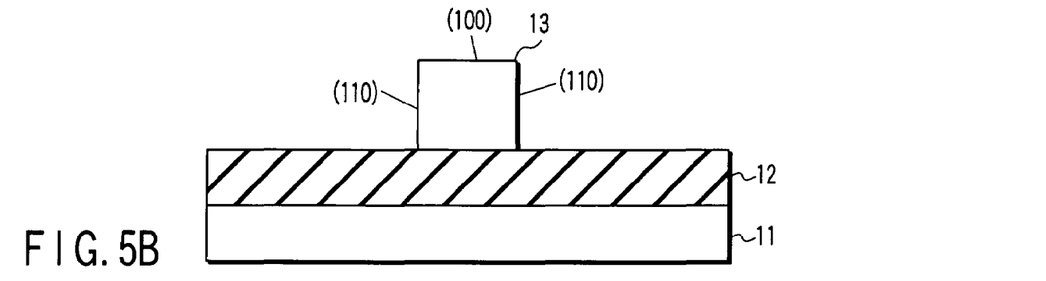
Figure 7:
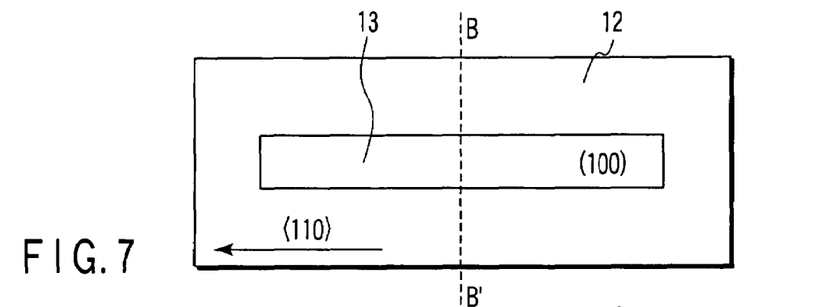
FIG. 7 is a plan view corresponding to FIG. 5B and showing a state in which an SiGe layer is formed into an island shape.

As shown in FIG. 5B, a fin serving as an active region of the multi-gate MISFET is formed on the substrate including the SiGe layer as described above. FIG. 7 is a plan view showing this state. FIG. 5B is a sectional view taken along a line B-B' in FIG. 7. As shown in FIG. 7, an island-like fin having a rectangular parallelepiped portion made of the SiGe layer 13 is formed along the <110>-axis direction.

Figure 8:
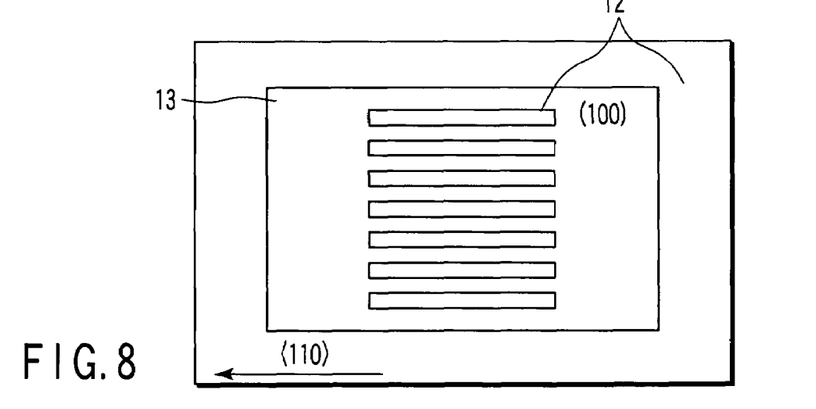
FIG. 8 is a plan view showing a modification of FIG. 7.

The fin may also be formed by anisotropic etching after a mask material is processed by normal photolithography or electron beam lithography. It is also possible to use a so-called sidewall transfer (SWT) process which forms sidewalls on a dummy member on the substrate and uses the sidewalls as masks for fin formation (Y.-K Choi et al., "Sub-20-nm CMOS FinFET Technologies", Technical Digest of International Electron Devices Meeting, pp. 421-24, 2001). The fin formation method is not limited at all. Although this embodiment discloses a MISFET having one fin, a MISFET having a plurality of fins as shown in FIG. 8 may also be fabricated.

Figure 5C:
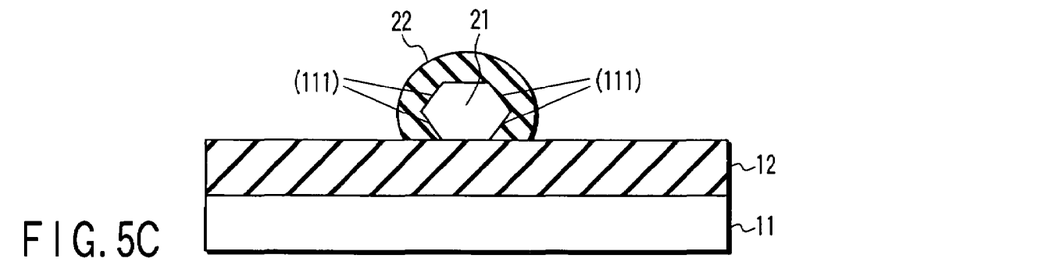

Then, as shown in FIG. 5C, the SiGe-containing fin formed as described above is oxidized. Although the oxidizing ambient need not be a 100%-oxygen ambient, it must be a dry ambient. The oxidizing temperature is not higher than the melting point of SiGe in the fin. The oxidizing temperature and oxidizing gas partial pressure need not be constant during oxidation and can be appropriately adjusted. When SiGe is oxidized in a dry ambient, Si selectively oxidizes, and Ge is condensed into the parent semiconductor. That is, the whole fin can be changed into a Ge layer 21 by performing oxidation until Si in the fin is entirely consumed. In this case, an Si oxide film 22 is formed around the Ge layer 21.

An oxidation amount necessary to completely change the fin into Ge is readily determined by the Ge composition (x) before oxidation, the fin width (Wfin), and the fin height (Hfin). Assume that the fin shape before oxidation is a complete rectangular parallelepiped, the oxidation rate is constant regardless of the plane orientation, and no new surface orientation appears by oxidation. When x=0.2, Wfin=50 nm, and Hfin=50 nm, for example, the fin completely changes into Ge if the oxide film thickness is 39 nm or more. However, the actual case is more complicated than this, i.e., the oxidation rate depends on a plane orientation.

Also, new surfaces (facets) arrear during oxidation-induced Ge condensation. More specifically, when a (100) substrate is used and a fin is formed in the same direction as an active region of a conventional planar MISFET in which the current direction is the <110> direction (fin side surfaces are (110) surfaces), (111) facets arrear on the fin side surfaces in the oxidation-induced Ge condensation process. These facets make a section in the channel width direction hexagonal. Accordingly, the multi-gate MISFET of this embodiment relaxes field concentration at fin corners and suppresses gate insulating film breakdown, compared to the conventional multi-gate MISFET having a rectangular section.

In addition, the channel sectional shape is symmetrical in both the vertical and horizontal directions. Theoretically, therefore, this channel sectional shape is suitable for a GAA-MISFET having the highest short channel effect immunity. It is also possible to apply a strain to the thus fabricated Ge fin structure without any semiconductor hetero-interface. More specifically, a compression strain can be applied in the source/drain direction, and this has a large effect of increasing the hole mobility. A strain is applied into the Ge fin because a semiconductor layer have properties of maintaining, during an oxidation-induced Ge condensation process, the lateral lattice constant before the condensation. That is, a compression strain is applied to the condensed Ge fin because the lattice constant of SiGe<the lattice constant of Ge.

Furthermore, the (111) plane of Ge is a plane orientation most superior in electron conduction characteristics (S. Takagi et al., "Re-examination of subband structure engineering in ultra-short channel MOSFETs under ballistic carrier transport", VLSI Technology 2003, Digest of Technical Papers, pp. 115-16, 2003). When compared to the use of (110) side surfaces formed on a normal fin, therefore, the current drive of an nMISFET presumably significantly increases (the drive current of an nMISFET: (111)>(100)>(110), the driving current of a pMISFET: (110)>(111)>(100)).

When a three-dimensional structure like a fin oxidizes, the oxidation stops at a certain film thickness under the influence of a stress acting on the oxide film if the structure is made of Si. This automatic oxidation stopping mechanism probably naturally appears during oxidation of SiGe. This presumably makes it possible to automatically stop oxidation when the fin has completely changed into Ge by properly setting the fin dimensions and Ge composition before the oxidation. This means that the oxidation process margin increases compared to the formation of GOI by oxidation-induced Ge condensation on a plane.

Also, when an SGOI layer is formed by performing oxidation-induced Ge condensation in a mesa structure like a fin, the defect density significantly decreases compared to a case in which oxidation-induced Ge condensation is performed on a whole substrate (T. Tezuka et al., "Dislocation-free relaxed SiGe-on-insulator mesa structures fabricated by high-temperature oxidation", Journal of Applied Physics, vol. 94, pp. 7553-59, 2001). In this embodiment, therefore, the defect density probably significantly decreases compared to a case in which a fin is formed after a GOI is formed on an entire substrate. This presumably reduces the leakage current.

Figure 5D:
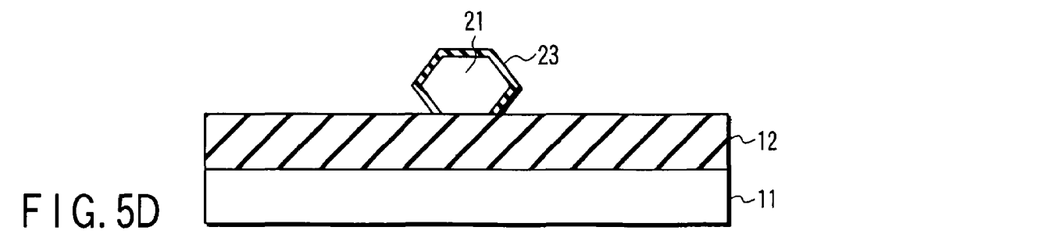

After the oxide film 22 formed by oxidation-induced Ge condensation is removed, a gate insulating film 23 is formed as shown in FIG. 5D. Subsequently, a multi-gate Ge MISFET is fabricated through the conventional micro-MISFET fabrication processes such as the formation of a gate electrode 24, extension doping layers 25, gate sidewall insulating films 26, and source/drain electrodes 27. A GAA-MISFET can also be fabricated by etching away the underlying buried oxide film (BOX) layer before the formation of the gate insulating film, and covering the whole channel with a gate.

As described above, this embodiment can relax field concentration at fin corners by making all angles formed by adjacent side surfaces of a fin larger than 90°, and making a section in the channel width direction symmetrical both vertically and horizontally. This makes it possible to suppress gate insulating film breakdown of the multi-gate MISFET, and form a fin shape having a vertically and horizontally symmetrical section in the channel width direction and suited to a GAA-MISFET.

Also, a Ge fin is formed by oxidation-induced Ge condensation after the formation of the fin including the SiGe layer. This significantly decreases the defect density and reduces the leakage current compared to a case in which a GOI is fabricated on a whole substrate. In addition, since the Ge concentration in the SiGe layer of the fin before oxidation-induced Ge condensation can be decreased, the fin can be fabricated by using a process similar to that for Si. Furthermore, a strain can be applied to the fin without introducing any semiconductor hetero-interface.

Moreover, the use of the automatic oxidation stopping mechanism increases the oxidation process margin of oxidation-induced Ge condensation. In addition to these advantages, in the structure in which the extension regions are made of Si or SiGe, hot carriers can be injected at the source end of a pMISFET. This increases the drive current.

Figure 9:
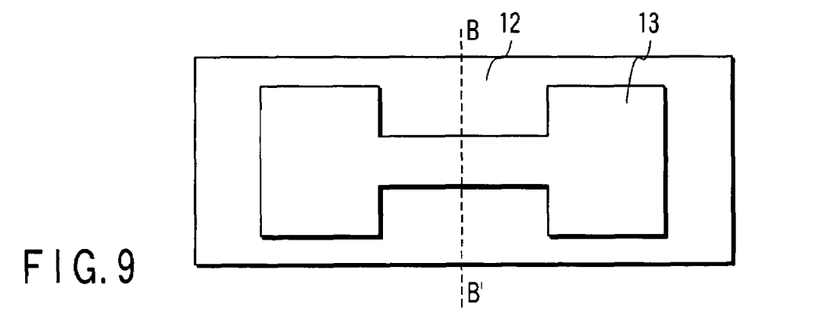
FIG. 9 is a plan view which explains a modification of the first embodiment and shows an example in which a BOX layer below an SiGe layer channel is removed.
Figure 10:
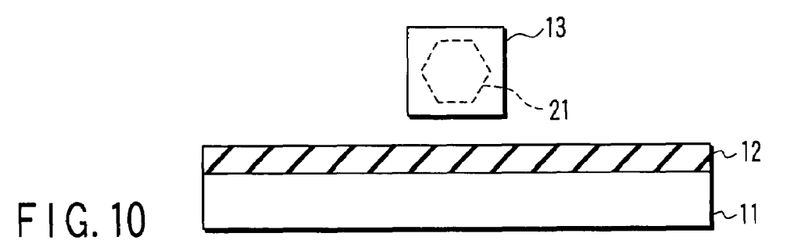
FIG. 10 is a view showing a section taken along a line B-B' in FIG. 9.

Note that this embodiment is based on the assumption that oxidation-induced Ge condensation is performed on the fin formed on the BOX layer. However, as shown in FIGS. 9 and 10, oxidation-induced Ge condensation may also be performed after the BOX layer below the channel is etched away. FIG. 9 is a plan view, and FIG. 10 is a sectional view taken along a line B-B' in FIG. 9. The dotted line in FIG. 10 indicates a Ge layer 21 formed by oxidation-induced Ge condensation.

In this case, a gate can also be formed on the bottom surface side of the Ge layer 21. As a consequence, a GAA-MISFET can be fabricated. Also, the interface between the SiGe layer 13 and insulating film 12 completely disappears, and this significantly decreases the possibility that defects such as dislocations are introduced during oxidation-induced Ge condensation. Accordingly, the leakage current can be further reduced.

Figure 11A:
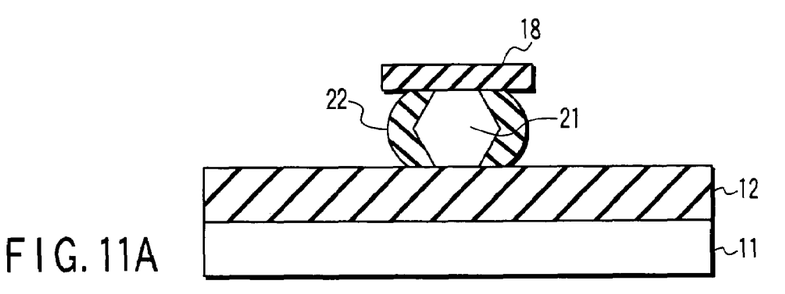
FIGS. 11A and 11B are sectional views showing other fabrication steps of the multi-gate MISFET according to the first embodiment.
Figure 11B:
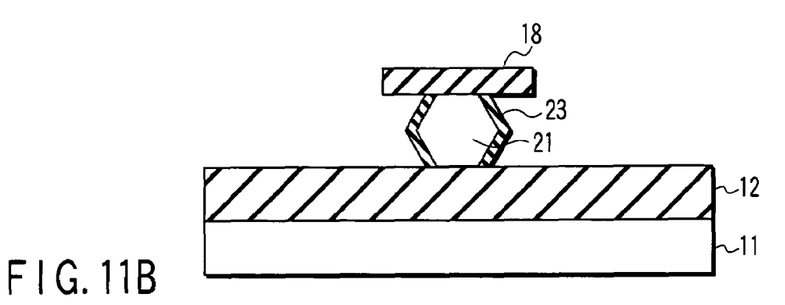

Furthermore, this embodiment is based on the assumption that the upper surface of the Ge layer 21 is also used as a channel, but it is also possible to use only the side surfaces except for the upper and lower surfaces as a channel. For example, as shown in FIG. 11A, oxidation-induced Ge condensation is performed while the mask material (e.g., an Si nitride film) 18 used in the formation of the fin is left behind on the upper surface of the fin. After that, as shown in FIG. 11B, an oxide film 22 formed by the oxidation-induced Ge condensation is removed, and a gate insulating film 23 is formed. This implements a multi-gate MISFET which uses only the side surfaces except for the upper and lower surfaces of the GE layer 21 as a channel.

Second Embodiment

Figure 12:
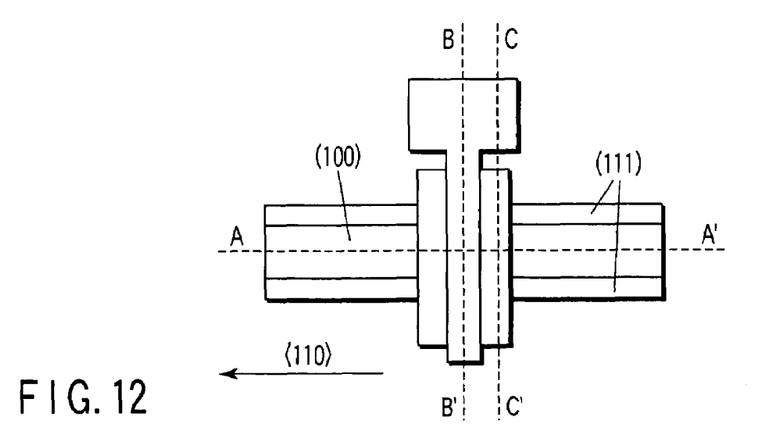
FIG. 12 is a plan view showing an outline of the arrangement of a multi-gate MISFET according to the second embodiment.
Figure 13:
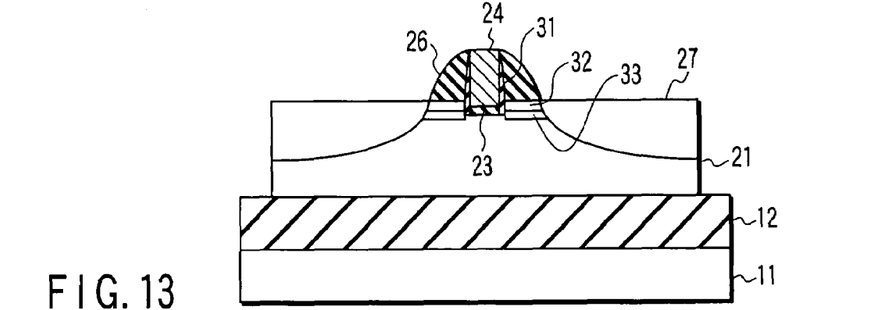
FIG. 13 is a view showing a section taken along a line A-A' in FIG. 12.
Figure 14:
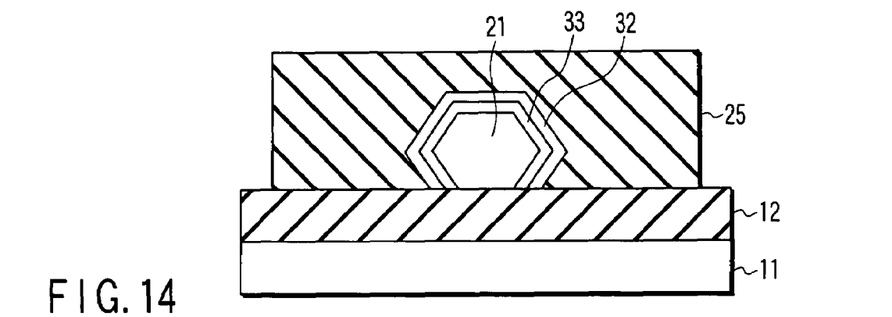
FIG. 14 is a view showing a section taken along a line C-C' in FIG. 12.

FIGS. 12 to 14 are views for explaining an outline of the arrangement of a multi-gate MISFET according to the second embodiment of the present invention. FIG. 12 is a plan view, FIG. 13 is a sectional view taken along a line A-A' in FIG. 12, and FIG. 14 is a sectional view taken along a line C-C' in FIG. 12. Note that the same reference numerals as in FIGS. 1 to 4 denote the same parts, and a detailed explanation thereof will be omitted.

A channel made of a Ge layer 21, a gate insulating film 23, and a gate electrode 24 are the same as those of the first embodiment. This embodiment differs from the first embodiment in that Si or SiGe is epitaxially grown on extension regions as heavily doped regions which connect the channel and source/drain electrodes 27 and on the source/drain electrodes 27, thereby forming a so-called elevated extension structure.

That is, thin sidewall insulating films 31 are formed on the side surfaces of the gate electrode 24 and gate insulating film 23. The gate electrode 24 and sidewall insulating films 31 are used as masks to perform epitaxial growth, thereby forming extension regions made of an Si layer 32 and SiGe layer 33 on the two sides of the channel. The upper surface position of the extension regions is higher than that of the channel. The source/drain electrodes 27 are formed to sandwich the extension regions. The source/drain electrodes 27 are made of germanosilicide or silicide.

FIGS. 15A, 15B, 16A, and 16B are schematic views showing main steps in order to explain the fabrication process of the MISFET structure according to the second embodiment.

Figure 15A:
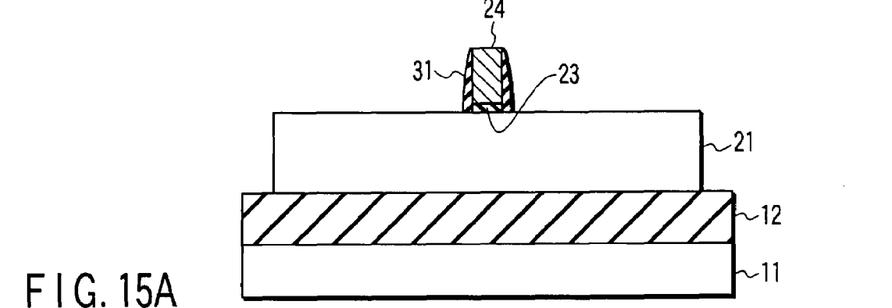
FIGS. 15A and 15B are sectional views showing the fabrication steps of the multi-gate MISFET according to the second embodiment.

An initial substrate, the formation of a fin shape, oxidation-induced Ge condensation of the fin, the formation of a gate insulating film, and the formation of a gate electrode are the same as in the first embodiment. After the gate electrode is formed, as shown in FIG. 15A, 1- to 20-nm-thick sidewall insulating films 31 are formed on the gate side surfaces by the conventional sidewall-etchback process using film deposition and anisotropic etching. The material of the insulating films 31 is desirably an Si nitride film.

Figure 15B:
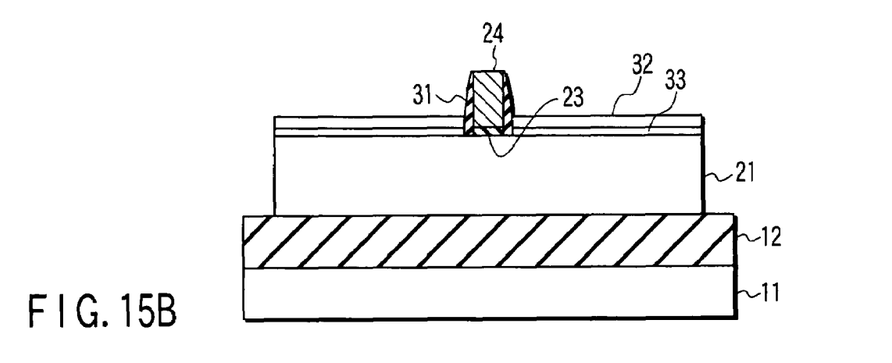

After that, ion implantation and activation annealing are appropriately performed, and a 1- to 50-nm-thick Si or SiGe layer is selectively epitaxially grown as shown in FIG. 15B. Even when Si is epitaxially grown, interdiffusion occurs between an epitaxially grown Si layer 32 and the underlying Ge layer. Therefore, an SiGe layer 33 having a thickness of a few nm is formed in the epitaxial interface. Annealing may also be performed after the epitaxial growth in order to promote the interdiffusion between Si and Ge.

Figure 16A:
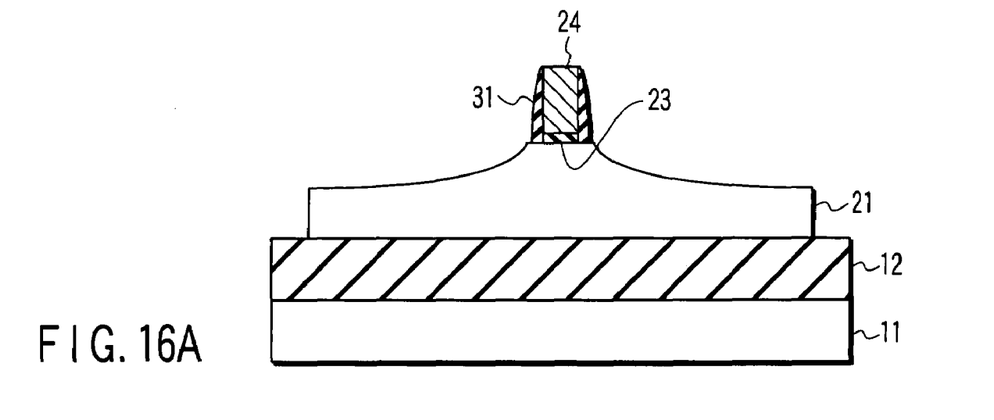
FIGS. 16A and 16B are sectional views showing other examples of the fabrication steps of the second embodiment.
Figure 16B:
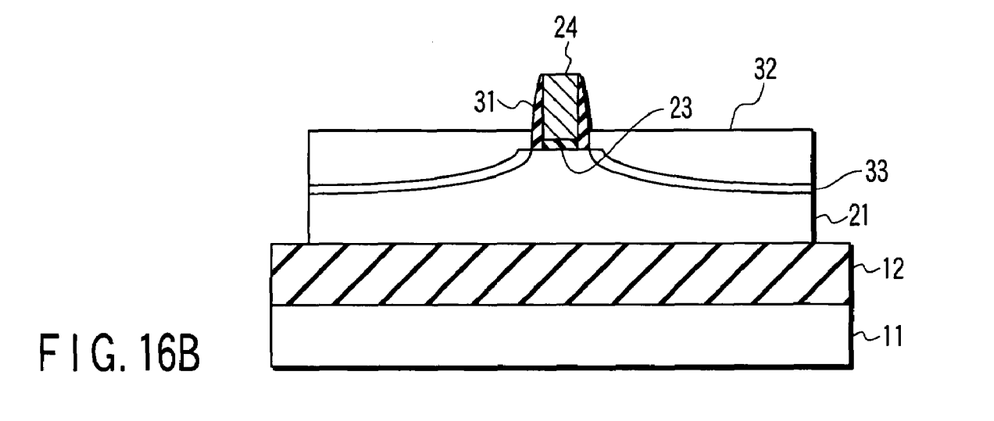

As shown in FIG. 16A, it is also possible in the step shown in FIG. 15A to etch away the extension region to depress the extension region surface from the channel surface. By selectively epitaxially growing Si or SiGe after that, the elevated extension structure can be implemented as shown in FIG. 16B.

Since the extension region is made of SiGe (Si) and the channel is made of Ge as described above, an energy gap (band offset) can be produced in the valence band between the extension and channel. More specifically, the energy of valence band edge of Ge in the channel is lower than that of SiGe in the extension region. In a pMISFET, therefore, hot carriers are injected at the source end, and this increases the carrier injection speed compared to a case in which the extension region is also made of Ge. As a consequence, the drive current increases. The effect of increasing the drive current by hot carrier injection using the source-end band offset as described above is already known (T. Mizuno et al., "High velocity electron injection MOSFETs for ballistic transistors using SiGe/strained-Si heterojunction source structures", VLSI Technology 2004, Digest of Technical Papers, pp. 202-3, 2004).

Also, the bandgap of SiGe (Si) is larger than that of Ge. This reduces the leakage current caused by band-to-band tunneling at the drain end which may result from a narrow-bandgap material such as Ge, or by intrinsic carriers. Note that a multi-gate Ge-MISFET can also be formed by appropriately performing ion implantation, activation annealing, and gate sidewall formation again after the selective epitaxial growth of Si, and then performing the conventional source/drain formation process.

Similar to the first embodiment, this embodiment is based on the assumption that oxidation-induced Ge condensation is performed on the fin formed on the BOX layer. However, as shown in FIGS. 9 and 10, oxidation-induced Ge condensation may also be performed after the BOX layer below the channel is etched away. Furthermore, this embodiment is based on the assumption that the upper surface of the Ge layer 21 is also used as a channel. However, as shown in FIGS. 11A and 11B, it is also possible to leave the mask material used in the formation of the fin behind on the fin upper surface, thereby using only the side surfaces as a channel.

(Modifications)

Note that the present invention is not limited to the above embodiments.

Each embodiment has explained a so-called MOS structure using an oxide film as a gate insulating film. However, the present invention is also applicable to a MIS structure using an insulating film other than an oxide film as a gate insulating film. A semiconductor layer is not necessarily limited to Ge, and it is possible to use various kinds of semiconductor materials.

Also, the semiconductor formation direction is not necessarily limited to the <110>-axis direction. Forming a semiconductor layer along the <110>-axis direction is effective because the side surfaces except for the upper and lower surfaces can be changed into (111) surfaces by oxidation-induced Ge condensation. However, these side surfaces need not always be (111) surfaces. The point is that the angles formed by adjacent side surfaces need only be larger than 90°. In addition, the corners formed by adjacent side surfaces of the semiconductor layer may also be slightly rounded.

Furthermore, the underlying substrate of the buried insulating film is not necessarily limited to a single-crystal Si substrate, and it is possible to use various kinds of semiconductor substrates.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor layer formed in an island shape along a given direction on an insulating film and having a plurality of side surfaces along the given direction, all inside angles being larger than 90° and formed between each side surface, and a section of the semiconductor layer perpendicular to the given direction being a hexagon which is vertically and horizontally symmetrical;

a gate insulating film formed on the side surfaces, the side surfaces to be used as a channel;

a gate electrode formed on the gate insulating film; and source and drain electrodes formed in contact with the semiconductor layer with the gate electrode being arranged between the source and drain electrodes.

2. A device according to claim 1, wherein the gate insulating film and the gate electrode are formed on all of the side surfaces so as to surround a portion of the semiconductor layer.

3. A device according to claim 1, wherein the semiconductor layer is made of Ge.

4. A device according to claim 1, wherein the channel of the semiconductor layer is made of Ge, and an extension layer made of a material selected from the group consisting of Si and SiGe is formed between each of the source and drain electrodes and the channel.

5. A device according to claim 1, wherein the channel of the semiconductor layer is made of Ge, and the source and drain electrodes are made of a material selected from the group consisting of germanide, germanosilicide, and silicide, and formed in contact with the channel.

6. A device according to claim 1, wherein the insulating film is formed on a (100) single-crystal semiconductor substrate, and the semiconductor layer is formed along a <110>-axis direction of the substrate.

7. A device according to claim 1, wherein four of the side surfaces are (111) surfaces.

8. A device according to claim 1, wherein the gate electrode is formed on the insulating film along a direction intersecting the given direction.

9. A device according to claim 1, wherein the semiconductor layer is made of Ge, and four of the side surfaces are (111) surfaces.

10. A semiconductor device comprising:

a (100) substrate;

a buried insulating film formed on the substrate;

a semiconductor layer formed on the buried insulating film in an island shape along a <110> axis direction of the substrate and having a plurality of side surfaces along the <110>-axis direction, all inside angles being larger than 90° and formed between each side surface, and a section of the semiconductor layer perpendicular to the <110> axis direction being a hexagon which is vertically and horizontally symmetrical;

a gate insulating film on the side surfaces, the side surfaces used as a channel, so as to surround a portion of the semiconductor layer;

a gate electrode formed on the gate insulating film so as to surround a portion of the semiconductor layer; and source and drain electrodes formed in contact with the semiconductor layer to sandwich the channel of the semiconductor layer which is surrounded by the gate electrode.

11. A device according to claim 10, wherein the gate insulating film and the gate electrode are formed on all the side surfaces along the <110>-axis direction so as to surround a portion of the semiconductor layer.

12. A device according to claim 10, wherein the semiconductor layer is made of Ge.

13. A device according to claim 10, wherein the channel of the semiconductor layer is made of Ge, and an extension layer made of a material selected from the group consisting of Si and SiGe is formed between each of the source and drain electrodes and the channel.

14. A device according to claim 10, wherein the channel of the semiconductor layer is made of Ge, and the source and drain electrodes are made of a material selected from the group consisting of germanide, germanosilicide, and silicide, and formed in contact with the channel region.

15. A device according to claim 10, wherein four of the side surfaces along the <110>-axis direction of the semiconductor layer are (111) surfaces.

16. A device according to claim 10, wherein the gate electrode is formed on the insulating film along a direction intersecting the <110>-axis direction.

17. A device according to claim 10, wherein the semiconductor layer is made of Ge, and four of the side surfaces are (111) surfaces.

* * * * *